(12) United States Patent
Odaohhara et al.

(10) Patent No.: US 7,663,374 B2
(45) Date of Patent: Feb. 16, 2010

(54) ELECTRICAL APPARATUS, COMPUTER SYSTEM, INTELLIGENT BATTERY, BATTERY DIAGNOSIS METHOD, BATTER-STATE DISPLAY METHOD, AND PROGRAM

(75) Inventors: Shigefumi Odaohhara, Yamato (JP); Masaki Kobayashi, Tokyo (JP); Takeshi Matsumoto, Fujisawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 1491 days.

(21) Appl. No.: 10/247,600

(22) Filed: Sep. 19, 2002

(65) Prior Publication Data

US 2003/0054229 A1 Mar. 20, 2003

(30) Foreign Application Priority Data

Sep. 19, 2001 (JP) .............................. 2001-285881

(51) Int. Cl.
*G01N 27/416* (2006.01)
(52) U.S. Cl. ...................................... 324/427; 320/132
(58) Field of Classification Search ................. 320/132, 320/130, 133, 134, 137, 149, 106, 112, 113, 320/114, 115, 128, 136, 155; 324/427
See application file for complete search history.

(56) References Cited

U.S. PATENT DOCUMENTS

| 4,289,836 | A | * | 9/1981 | Lemelson .................... 429/61 |
| 4,595,880 | A | * | 6/1986 | Patil .......................... 324/427 |
| 5,140,310 | A | * | 8/1992 | DeLuca et al. ........... 340/636.1 |
| 5,406,188 | A | * | 4/1995 | Myslinski et al. ........ 340/636.1 |
| 5,506,620 | A | * | 4/1996 | Ozawa ................... 348/333.02 |
| 5,608,306 | A | * | 3/1997 | Rybeck et al. .............. 320/106 |
| 5,621,299 | A | * | 4/1997 | Krall ........................... 320/103 |
| 5,652,569 | A | * | 7/1997 | Gerstenberger et al. .. 340/573.4 |
| 5,751,134 | A | * | 5/1998 | Hoerner et al. ............. 320/124 |
| 5,754,029 | A | * | 5/1998 | Mann et al. ................. 320/106 |
| 5,904,707 | A | * | 5/1999 | Ochs et al. ..................... 607/6 |
| 6,177,879 | B1 | * | 1/2001 | Kokubu et al. ............. 340/5.4 |
| 6,198,254 | B1 | * | 3/2001 | Satake et al. ................ 320/132 |
| 6,304,061 | B1 | * | 10/2001 | Toya .......................... 320/134 |
| 6,439,941 | B2 | * | 8/2002 | McClure et al. .............. 441/89 |
| 6,630,814 | B2 | * | 10/2003 | Ptasinski et al. ............ 320/132 |
| 6,659,934 | B1 | * | 12/2003 | Hughett et al. ................. 600/7 |
| 6,820,205 | B2 | * | 11/2004 | Odaohhara et al. ......... 713/300 |
| 2001/0022518 | A1 | * | 9/2001 | Asakura et al. ............. 324/426 |
| 2002/0113575 | A1 | * | 8/2002 | Lee ............................ 320/132 |

FOREIGN PATENT DOCUMENTS

| GB | 2274871 | * | 8/1994 |
| JP | 2000-060007 | | 2/2000 |
| JP | 2000-260486 | | 9/2000 |
| JP | 2001117508 A | * | 4/2001 |

* cited by examiner

*Primary Examiner*—Patrick J Assouad
*Assistant Examiner*—Samuel Berhanu
(74) *Attorney, Agent, or Firm*—Anthony P. Ng; Dillon & Yudell LLP

(57) ABSTRACT

An electrical apparatus includes a body for consuming power; a battery for supplying power to the body, wherein the body is capable of detecting an installation of the battery into the body, correlating the installation of the battery to a current real-time date, and displaying the date on which the battery was first installed in the body; and a display of a full charge capacity of the battery, the full charge capacity being calculated by comparing an actual present capacity of the battery to an estimated present capacity of the battery.

33 Claims, 11 Drawing Sheets

[Figure 1]
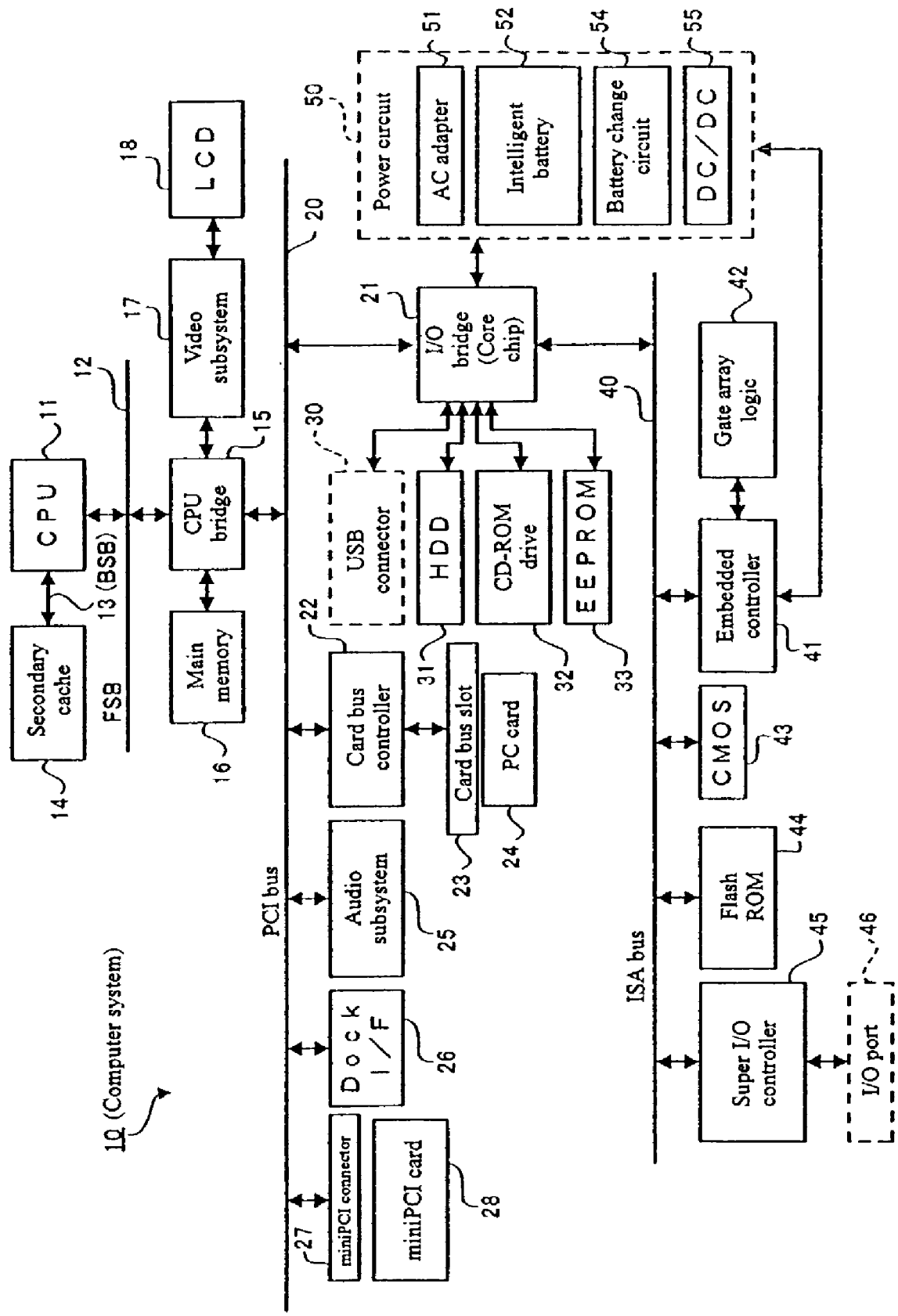

[Figure 2]
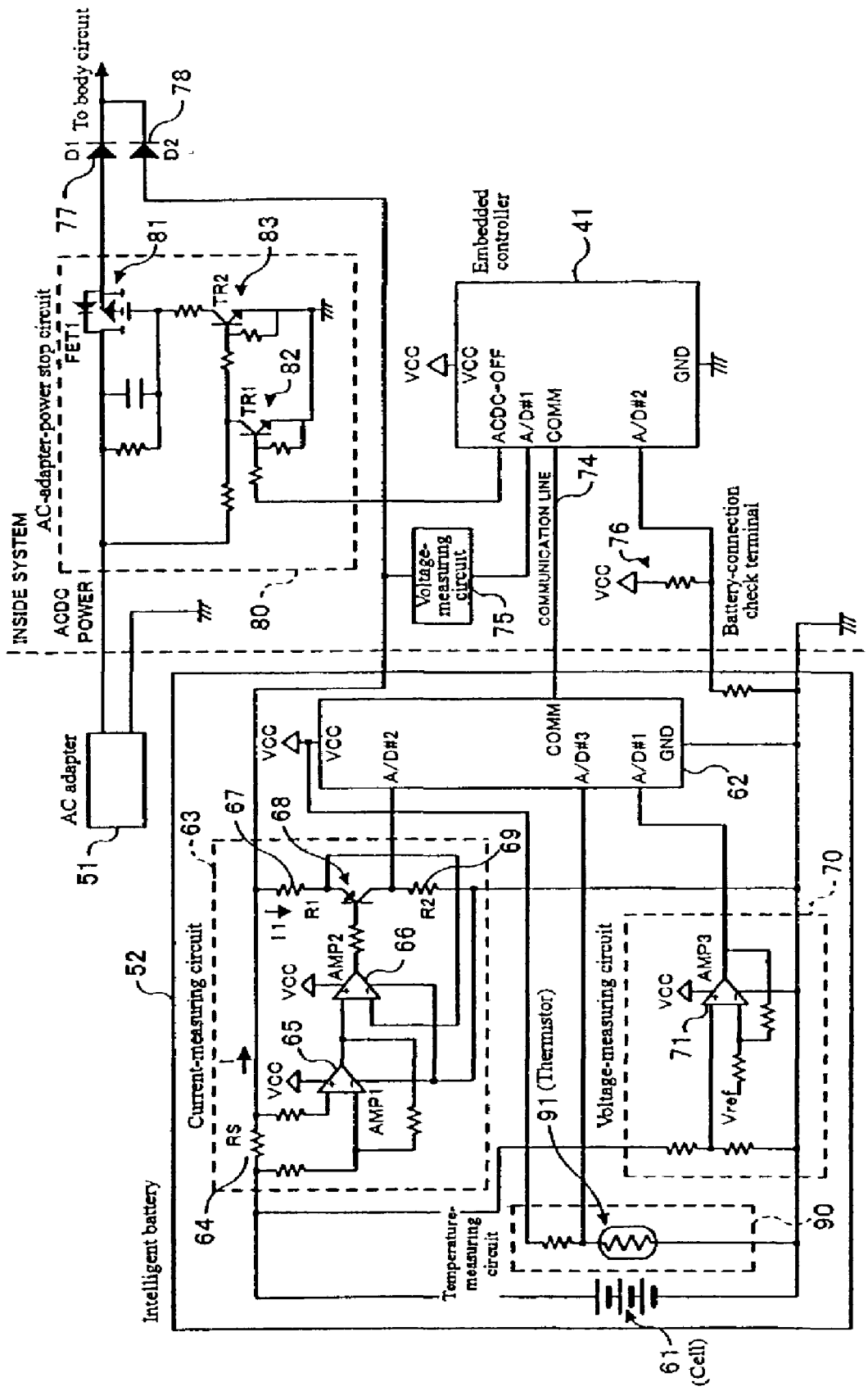

[Figure 3]
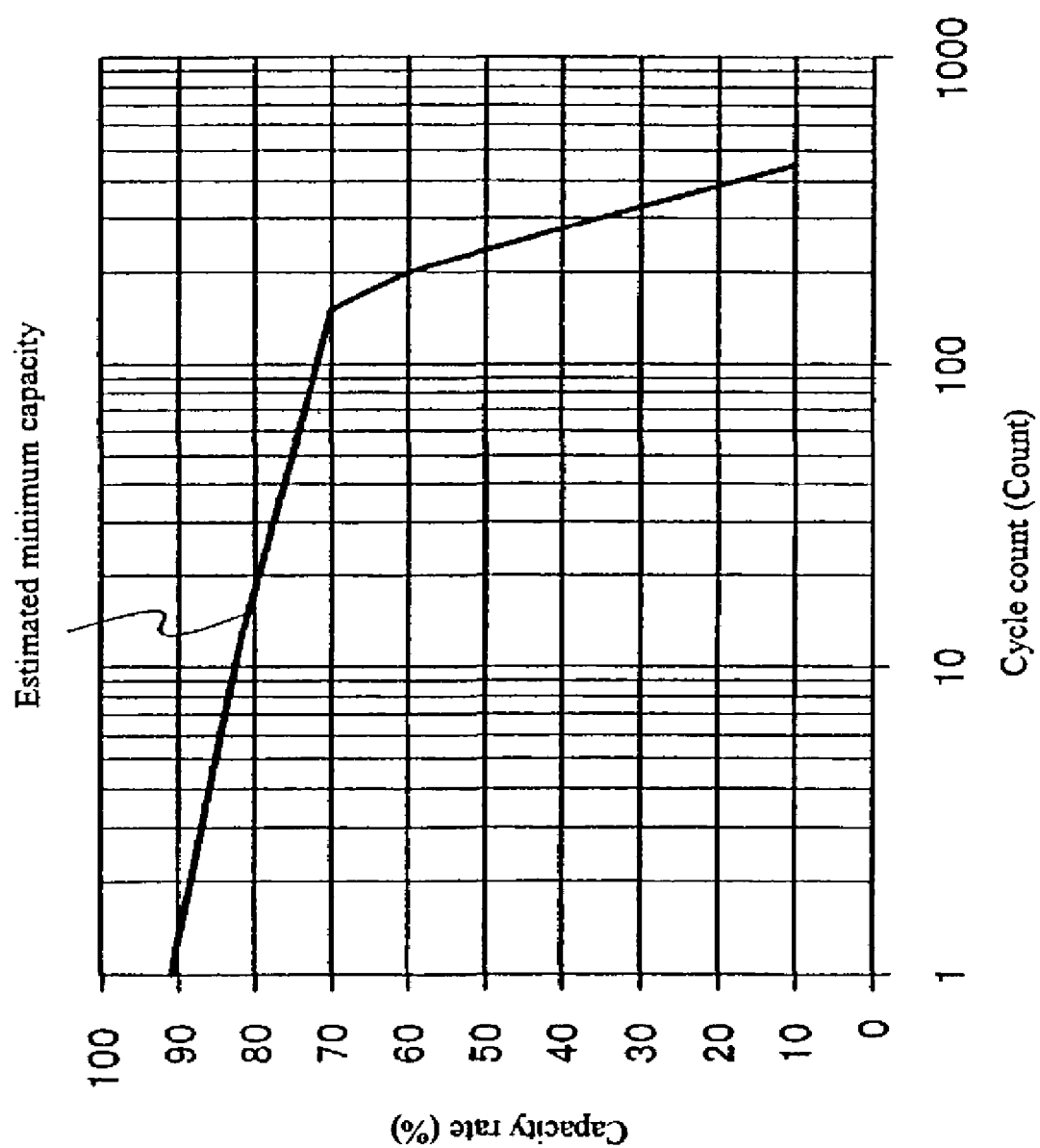

[Figure 4]
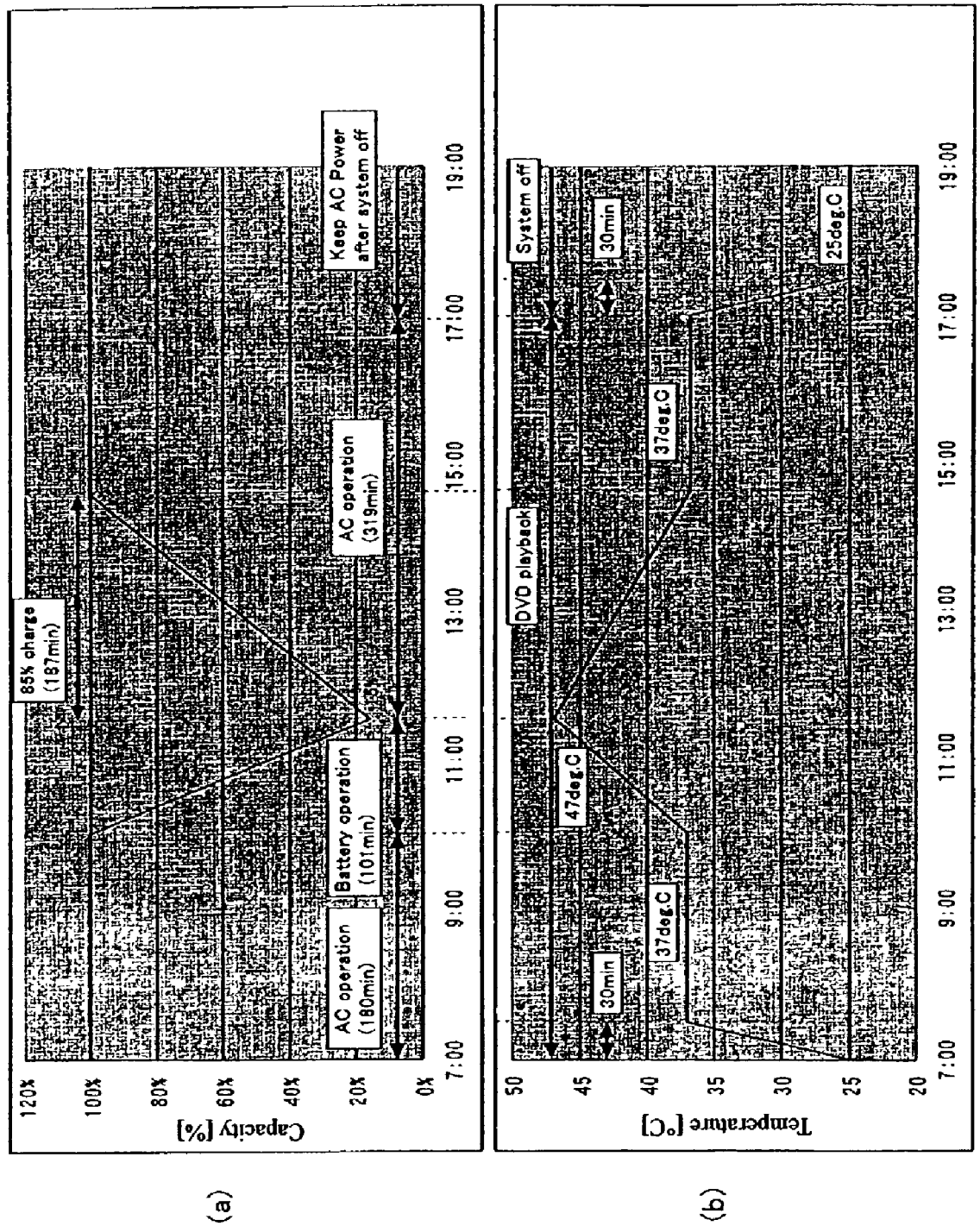

[Figure 5]
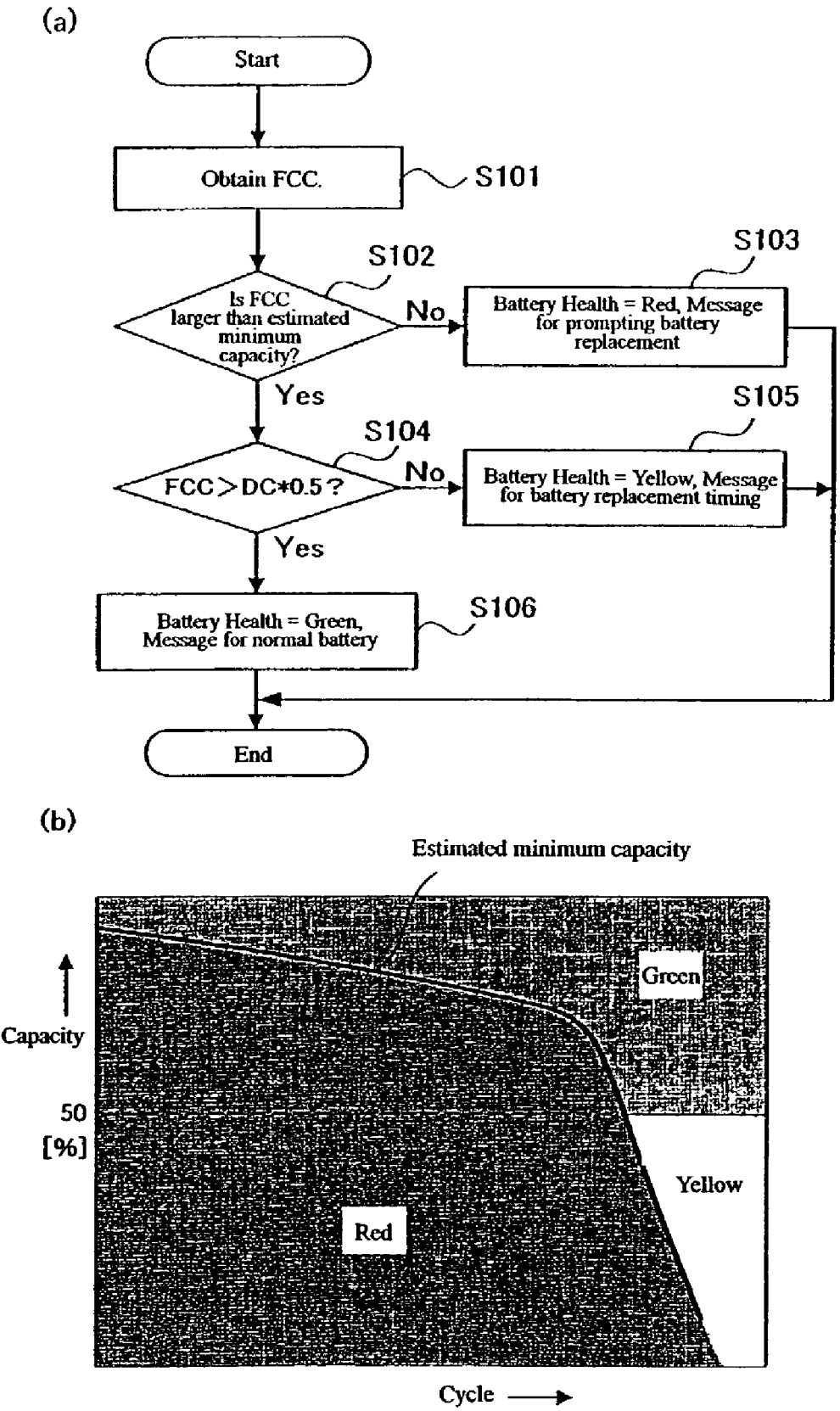

[Figure 6]
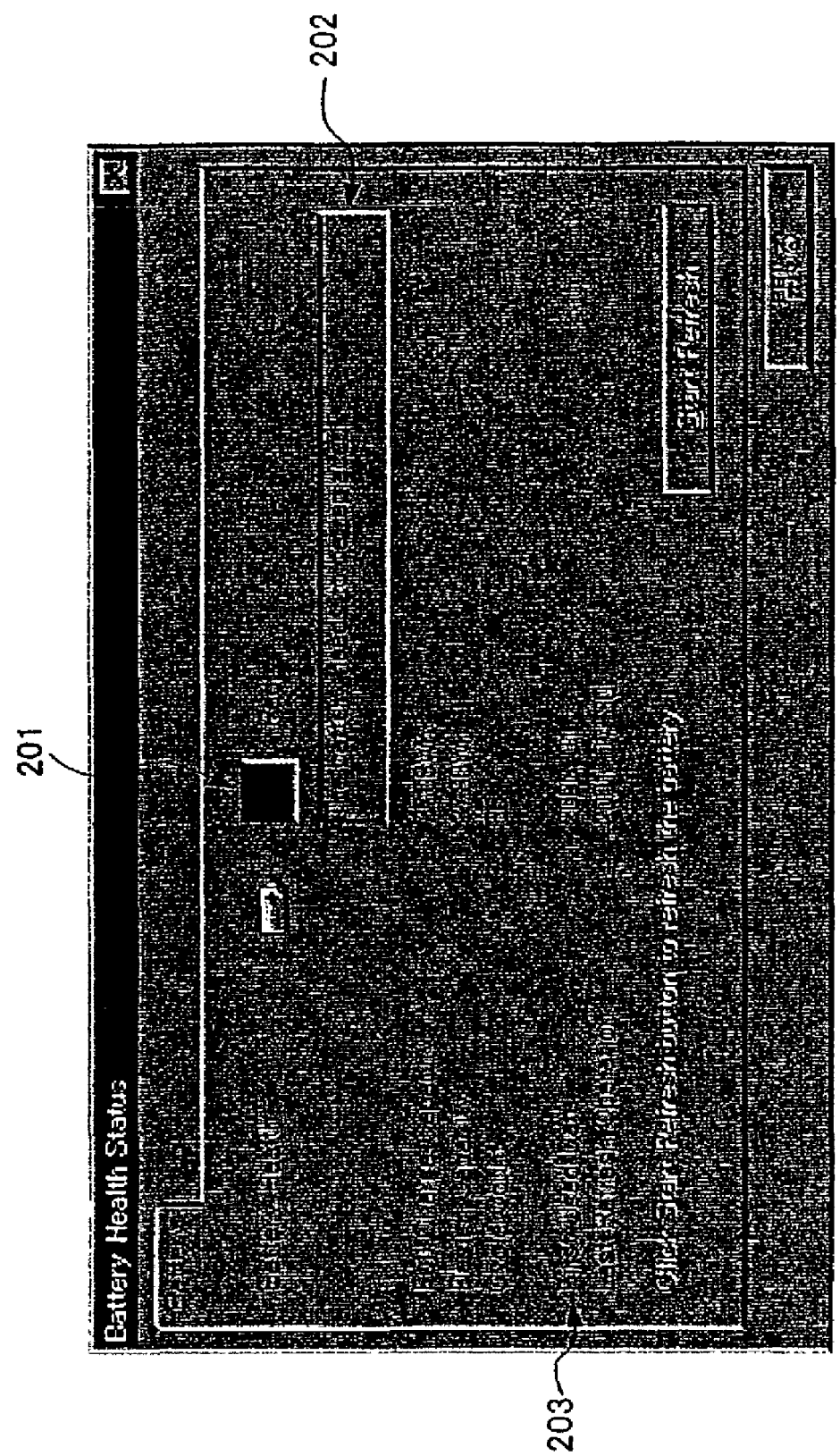

[Figure 7]
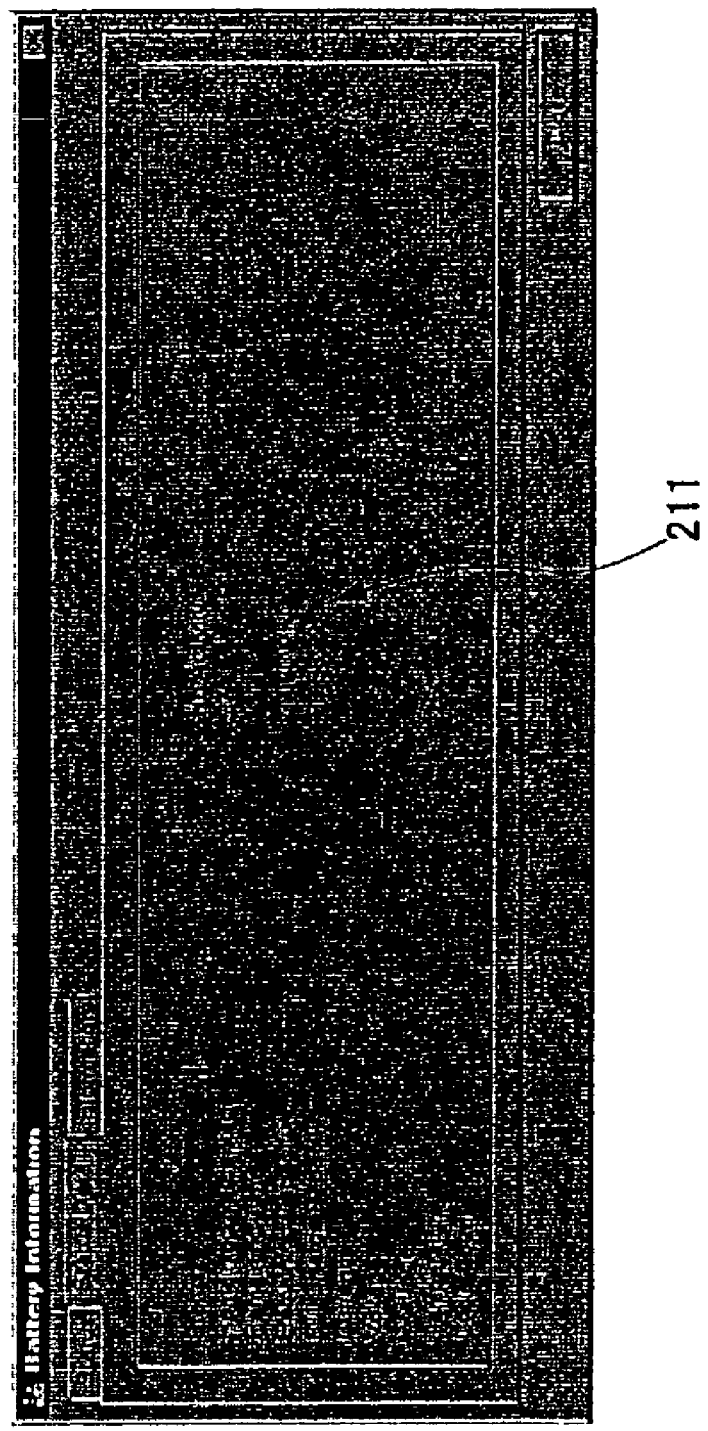

[Figure 8]
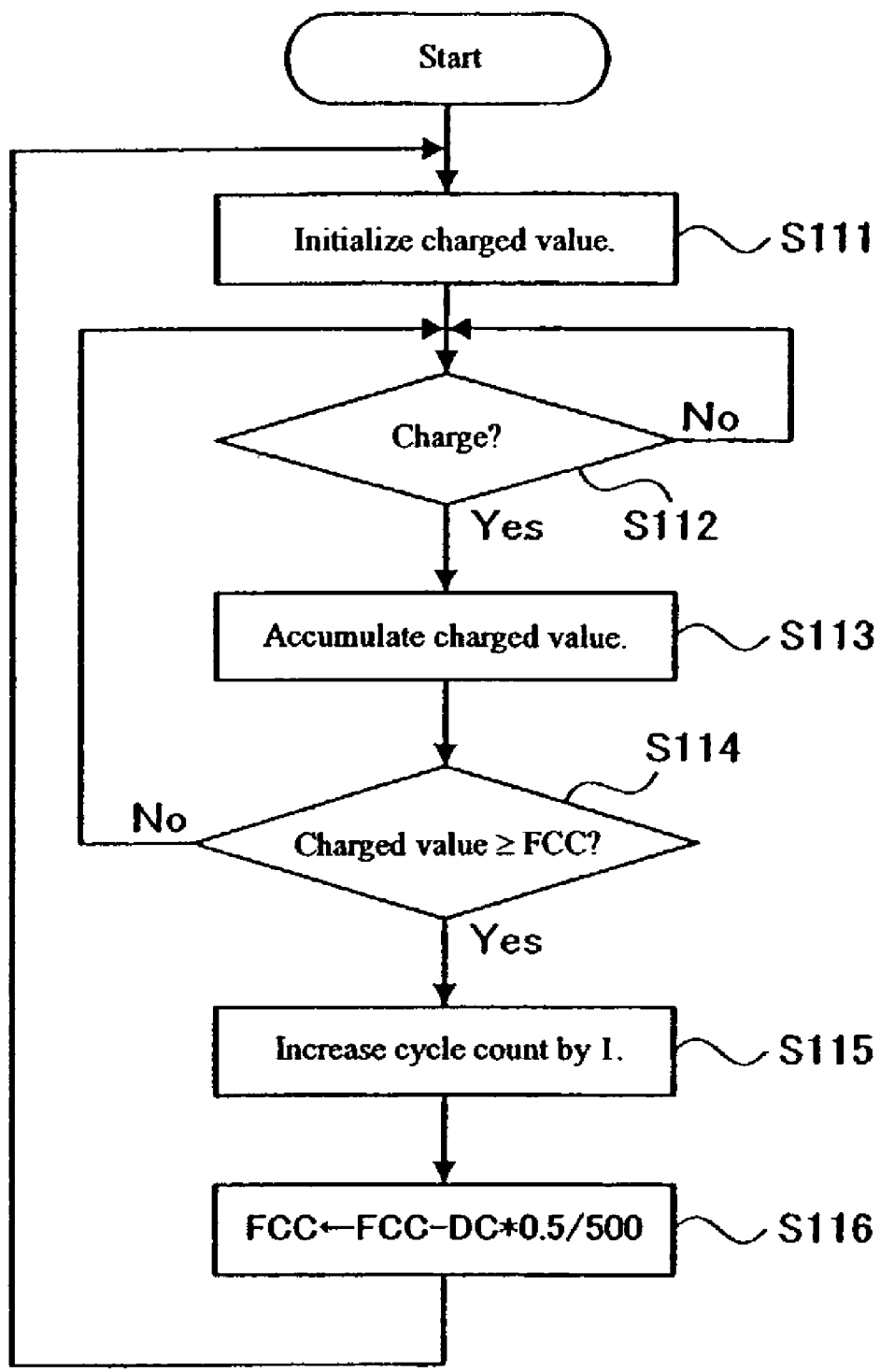

[Figure 9]
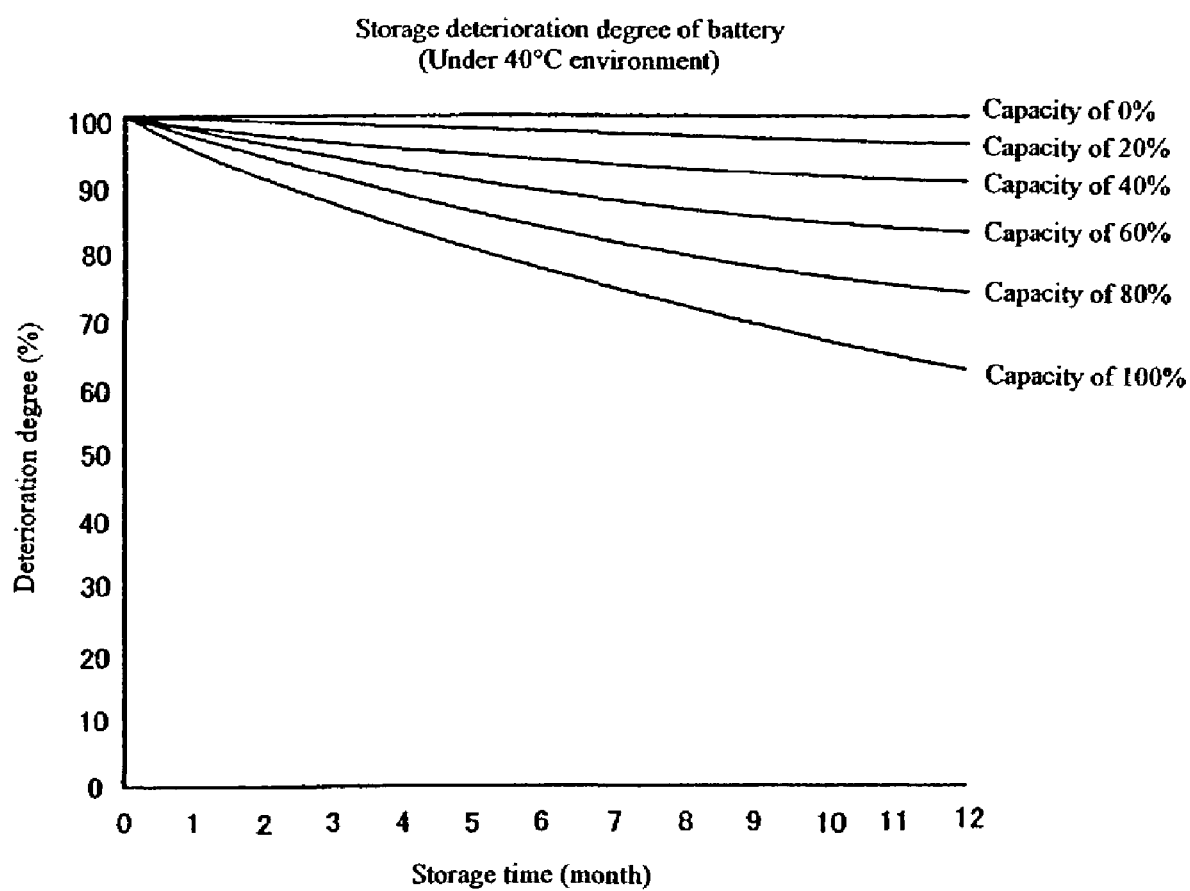

[Figure 10]
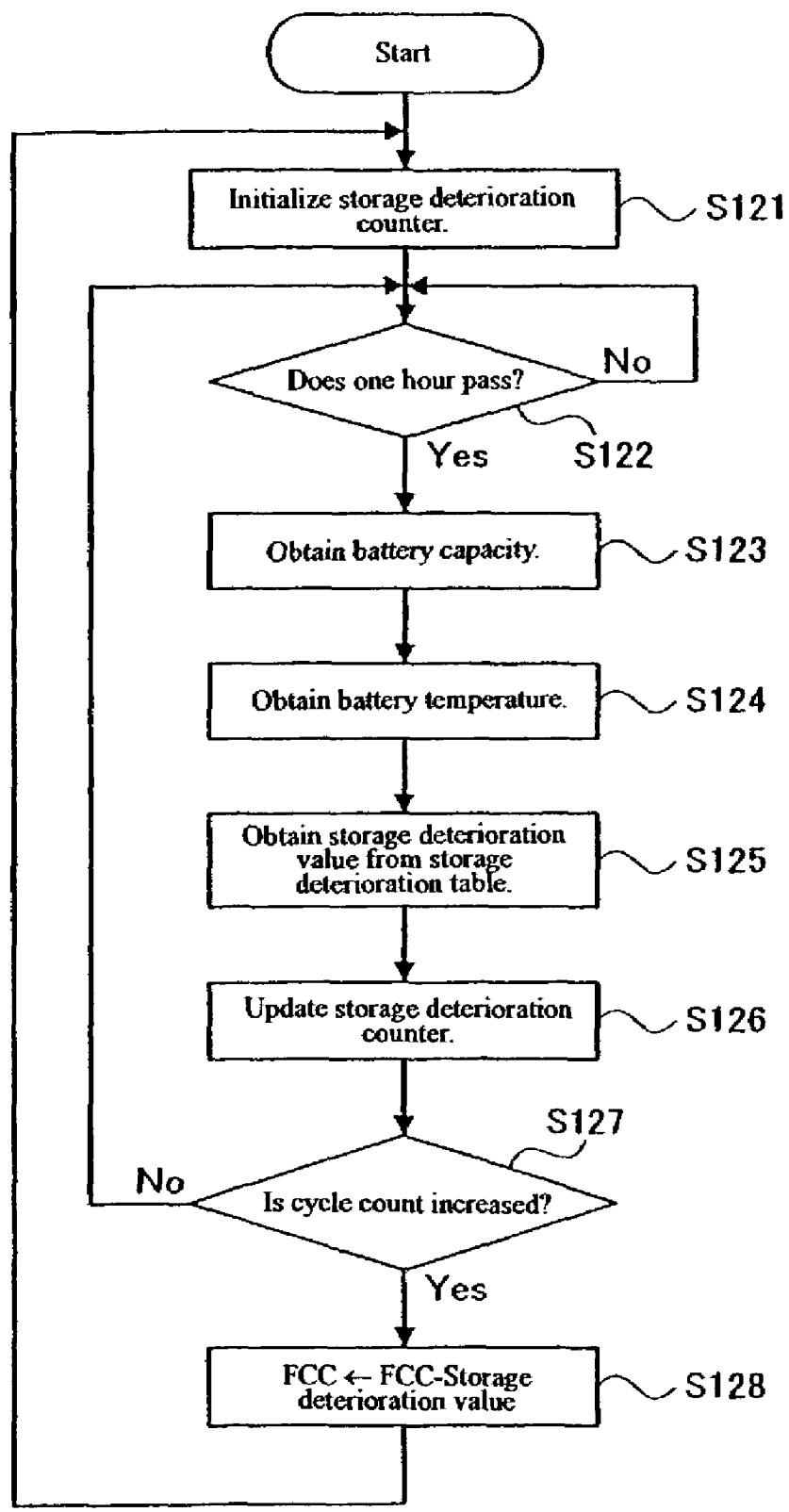

[Figure 11]
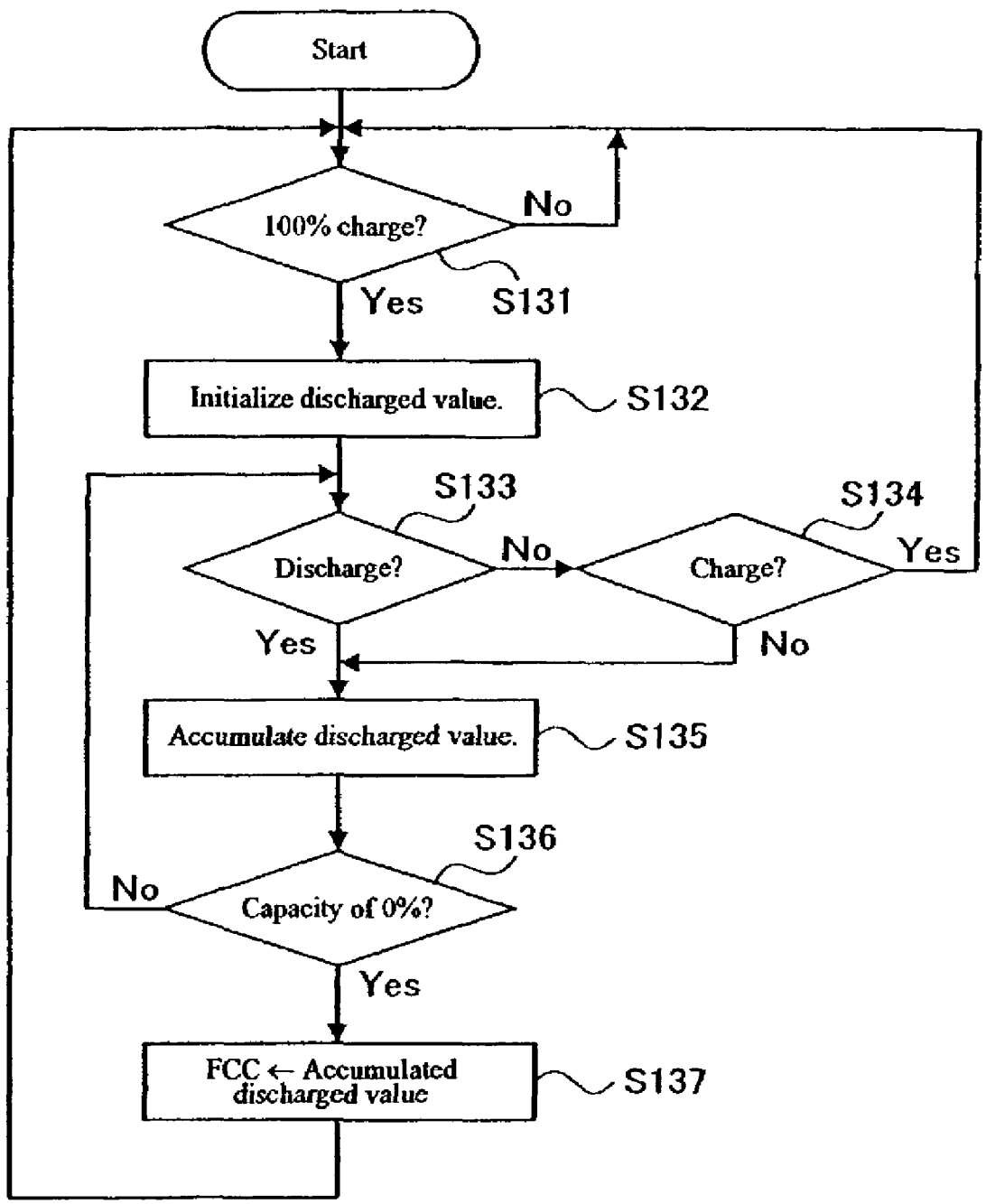

ELECTRICAL APPARATUS, COMPUTER SYSTEM, INTELLIGENT BATTERY, BATTERY DIAGNOSIS METHOD, BATTER-STATE DISPLAY METHOD, AND PROGRAM

BACKGROUND OF THE INVENTION

The present invention relates to an electrical apparatus or the like provided with a battery which can be used by repeating charge and discharge and more particularly to an electrical apparatus or the like capable of determining a failed state of a battery.

Power is supplied to various electrical apparatuses such as an information terminal unit represented by a notebook-type personal computer (notebook PC), a PDA (Personal Digital Assistant), an MD (Mini Disk), and a video camera not only directly from a commercial power source but also from a battery (such as storage battery, secondary battery, or battery) which can be used many times while repeating charge and discharge. The battery uses a nickel-hydrogen battery or a nickel-cadmium battery that has a comparatively large capacity and is inexpensive. Moreover, a lithium-ion battery having a high energy density for unit weight compared to a nickel-cadmium battery and a lithium-polymer battery using a solid polymer instead of using a liquid electrolyte are used.

In the case of the battery representing the nickel-hydrogen battery, nickel-cadmium battery, lithium-ion battery, and lithium-polymer battery, the operating time is shortened when the service life of the battery expires. Therefore, users have a strong request for accurately knowing the service life of the battery. Therefore, there are some conventional electrical products each of which is constituted so as to show a state of a battery to users by displaying the data for the voltage, current, and capacity (%) of the battery.

However, conventional display of the voltage (V), current (A), and capacity (%) of a battery is only display of the basic data for the battery. Therefore, a user cannot determine whether a battery has a trouble and its guarantee period expires only from the basic data.

Moreover, when a user feels that the operating time of a battery is shortened, the user cannot determine whether the operating time is shorted due to a trouble of the battery or because battery is used after its guarantee period expires. Therefore, it is difficult for the user or a company receiving an inquiry from the user to take correct measures.

The present invention is made to solve the above technical problems and its object is to accurately determine whether a unit having a battery for supplying power to the body while repeating charge and discharge has a failure in the battery.

It is another object of the present invention to determine whether the guarantee period of a battery expires and take proper measures.

SUMMARY OF THE INVENTION

In accordance with a preferred embodiment of the present invention, a full charge capacity (FCC) value of a rechargeable battery is initially obtained. A determination is made whether or not the FCC value is greater than an estimated minimum capacity value. If the FCC value is not greater than the estimated minimum capacity value, then a first message indicating a first health condition of said rechargeable battery is displayed. However, if the FCC value is greater than the estimated minimum capacity value, then a determination is made whether or not the FCC value is greater than an acceptable battery health value. If the FCC value is not greater than the acceptable battery health value, a second message indicating a second health condition of the rechargeable battery is displayed. Otherwise, if the FCC value is greater than the acceptable battery health value, a third message indicating a third health condition of the rechargeable battery is displayed.

BRIEF DESCRIPTION OF THE DRAWINGS

FIG. 1 is an illustration showing a hardware configuration of a computer system to which the above embodiment is applied;

FIG. 2 is an illustration showing a circuit configuration of a power-supply system;

FIG. 3 is an illustration showing an estimated minimum capacity of a battery;

FIGS. 4(a) and 4(b) are illustrations showing assumed patterns to be used which most deteriorate a battery;

FIGS. 5(a) and 5(b) are illustrations showing the processing for troubleshooting a battery;

FIG. 6 is an illustration showing an indication for battery diagnosis;

FIG. 7 is an illustration showing another indication for battery diagnosis;

FIG. 8 is a flowchart showing the processing for correcting cycle deterioration;

FIG. 9 is an illustration showing storage-deterioration characteristics of a lithium-ion battery;

FIG. 10 is a flowchart showing the processing for correcting storage deterioration; and FIG. 11 is an illustration showing the flow of update of a full charge capacity in accordance with capacity learning.

DESCRIPTION OF THE PREFERRED EMBODIMENTS

The present invention is described below in detail in accordance with the embodiment shown in the accompanying drawings.

FIG. 1 is an illustration showing a hardware configuration of a computer system 10 to which this embodiment is applied. A computer provided with the computer system 10 is constituted as a notebook PC (notebook-type personal computer) mounting a predetermined OS (operating system) in accordance with, for example, the OADG (Open Architecture Developer's Group) specification.

In the case of the computer system 10 shown in FIG. 1, a CPU 11 functions as brains of the whole computer system 10 and executes various programs in addition to a utility program under the control by the OS. The CPU 11 is connected with components through buses of three stages such as an FSB (Front Side Bus) 12 serving as a system bus, a PCI (Peripheral Component Interconnect) bus 20 serving as a high-speed I/O-drive bus, and an ISA (Industry Standard Architecture) bus 40 serving as a low-speed I/O-drive bus. The CPU 11 accelerates processings by storing program codes and data in a cache memory. In recent years, an SRAM of approx. 128 KB is integrated in the CPU 11 as a primary cache. To make up for a capacity deficiency, a secondary cache 14 of approx. 512 KB to 2 MB is set through a BSB (Back Side Bus) 13 serving as a dedicated bus. Moreover, it is possible to reduce cost by omitting the BSB 13, connecting the secondary cache 14 to the FSB 12, and thereby avoiding a package having a large number of terminals.

The FSB 12 and PCI bus 20 are connected each other by a CPU bridge (host-PCI bridge) 15 referred to as a memory/PCI chip. The CPU bridge 15 is constituted by including a memory-controller function for controlling the access operation to a main memory 16 and a configuration including a data buffer for absorbing the difference of data transfer rate between the FSB 12 and the PCI bus 20. The main memory 16 is a writable memory used as an area in which an execution program of the CPU 11 is read or a work area in which execution-program processing data is written. For example, the main memory 16 is constituted by a plurality of DRAM chips, normally equipped with 64 MB, and can be extended up to 320 MB. The execution program includes various drivers for hardware-operating OSs and peripheral units, an application program for a specific business, and firmware such as a BIOS (Basic Input/Output System) stored in a flash RAM 44 to be described later.

A video subsystem 17 is a subsystem for realizing a function relating to video and includes a video controller. The video controller processes a drawing instruction sent from the CPU 11 and writes processed drawing information in a video memory and reads the drawing information from the video memory to output the information to a liquid-crystal display (LCD) 18 as drawing data.

The PCI bus 20 is a bus capable of transferring data at a comparatively high speed, which is standardized by the specification in which a data bus width is set to 32 or 64 bits, the maximum operating frequency is set to 33 or 66 MHz, and the maximum data transfer rate is set to 132 or 528 MB/sec. The PCI bus 20 connects with an I/O bridge 21, a card bus controller 22, an audio subsystem 25, a docking station interface (Dock I/F) 26, and a mini PCI connector 27.

The card bus controller 22 is a dedicated controller for directly connecting a bus signal of the PCI bus 20 to the interface connector (card bus) of a card bus slot 23 and it is possible to set a PC card 24 to the card bus slot 23. The docking station interface 26 is hardware for connecting a docking station (not illustrated) serving as a function extension unit of the computer system 10. When a notebook PC is set to the docking station, various hardware elements connected to an internal bus of the docking station are connected to the PCI bus 20 through the docking station interface 26. Moreover, a mini-PCI (miniPCI) card is connected to the miniPCI connector 27.

The I/O bridge 21 has a bridge function between the PCI bus 20 and the ISA bus 40. Moreover, the I/O bridge 20 is provided with a DMA controller function, programmable interrupt controller (PIC) function, programmable interval time (PIT) function, IDE (Integrated Device Electronics) interface function, USB (Universal Serial Bus) function, and SMB (System Management Bus) interface function and has a built-in real-time clock (RTC).

The DMA controller function is a function for transfer data between a peripheral equipment such as an FDD and the main memory 16 without using the CPU 11. The PIC function is a function for executing a predetermined program (interrupt handler) in response to an interrupt request (IRQ) sent from a peripheral equipment. The PIT function is a function for generating a timer signal at a predetermined cycle. Moreover, an interface realized by the IDE interface function connects with not only an IDE hard disk drive (HDD) 31 but also a CD-ROM drive 32 through an ATAPI (AT Attachment Packet Interface). It is allowed that the interface connects with other type of IDE device such as a DVD (Digital Versatile Disk) instead of the CD-ROM drive 32. External memories such as the HDD 31 and CD-ROM drive 32 are set in a housing place referred to as "media bay" or "device bay". These normally-set external memories may be exclusively set so as to be replaceable with other unit.

Moreover, the I/O bridge 21 is provided with a USB port and the USB port is connected with a USB connector 30 set to the wall surface of a notebook PC. Furthermore, the I/O bridge 21 connects with an EEPROM 33 through an SM bus. The EEPROM 33 is a memory for holding pieces of information such as a password, supervisor password, and product serial number entered by a user, which is nonvolatile and whose storage contents can be electrically rewritten.

Furthermore, the I/O bridge 21 connects with a power circuit 50. The power circuit 50 is provided with an AC adapter 51 connected to, for example, a commercial power source of 100 VAC to perform AC/DC conversion, an intelligent battery 52 serving as a secondary battery, a battery change circuit 54 for charging the intelligent battery 52 and changing power-supply routes from the AC adapter 51 and intelligent battery 52, and a DC/DC converter (DC/DC) 55 for generating DC constant voltages such as +15 V, +5 V, and +3.3 V used for the computer system 10.

Moreover, an internal register for controlling power-source states of the computer system 10 and a logic (state machine) for controlling power-source states of the computer system 10 including operations of the internal register are set in a core chip constituting the I/O bridge 21. The logic transceives various signals to and from the power circuit 50 and recognizes an actual power-supply state from the power circuit 50 to the computer system 10 in accordance with the above signal transception. The power circuit 50 controls the power supply to the computer system 10 in accordance with a designation from the logic.

The ISA bus 40 is a bus having a transfer rate lower than that of the PCI bus 20 (e.g. bus width of 16 bits, maximum data transfer rate of 4 MB/sec). The ISA bus 40 connects with an embedded controller 41, CMOS 43, flash ROM 44, super I/O controller 45 connected to a gate array logic 42. Moreover, the ISA bus 40 is used to connect a peripheral equipment operating at a comparatively low speed such as a keyboard/mouse controller. The super I/O controller 45 connects with an I/O part 46 to drive an FDD and control input/output of parallel data (PIO) through a parallel port and input/output of serial data (SIO) through a serial port.

The embedded controller 41 controls a not-illustrated keyboard and is connected to the power circuit 50 to bear a part of the power-source management function by a built-in power management controller (PMC) together with the gate array logic 42.

Then, a power-supply system is described which is a characteristic configuration of this embodiment.

FIG. 2 is an illustration showing a circuit configuration of this power-supply system. The power-supply system is constituted by adding the embedded controller 41 and an AC-adapter-power stop circuit 80 to the power circuit 50 shown in FIG. 1.

The power-supply system shown in FIG. 2 includes an AC adapter 51 serving as a power-supply unit connected to a commercial power source and the intelligent battery 52 which is a secondary battery constituted by a lithium-ion battery used while repeating charge and discharge and conforming to an SBS (Smart Battery System). Powers supplied from the AC adapter 51 and intelligent battery 52 are output the body system circuit of the computer system 10 via the DC/DC converter 55 shown in FIG. 1.

Moreover, the power-supply system shown in FIG. 2 is provided with not only the embedded controller 41 for communicating with the intelligent battery 52 through a communication line 74 as the body system but also a voltage-measuring circuit 75 for measuring a voltage under over-discharge and communicating the measurement result to the embedded controller 41, and a battery-connection check terminal 76 for confirming whether the intelligent battery 52 is connected under over-discharge as the body system. Furthermore, the system comprises an AC-adapter-power stop circuit 80 for refreshing the intelligent battery 52 and a first diode (D1) 77 and a second diode (D2) 78 for performing rectification so that the power supply from the AC adapter 51 does not collide with the power supply from the intelligent battery 52.

Though the AC adapter 51 serving as a power-supply unit is generally set outside of a unit 20 storing the computer system 10 serving as a body (internal) system in the case of an electrical apparatus such as a notebook PC, it may be set inside of the case of the electrical apparatus. A configuration in which an AC inlet or DC inlet through which a connector of a cable can be set or removed is considered as the body system. The AC inlet and DC inlet are respectively constituted so that a connector extended from a cable connected to the AC adapter 51 can be set or removed when the AC adapter 51 is set outside of the body system and so that a connector directly connected to a commercial power source can be set or removed when the adapter 51 is set inside of the body system.

The intelligent battery 52 may be removable from the body system or may be set in the case of an electrical apparatus as a battery pack.

Then, an internal configuration of the intelligent battery 52 is described below. As shown in FIG. 2, the intelligent battery 52 comprises a cell 61 constituted by a plurality of single cells as a battery to be charged or discharged, a CPU 62 for controlling the intelligent battery 52 and communicating with the embedded controller 41 through the communication line 74, a current-measuring circuit 63 for obtaining a current value charged by or discharged from the intelligent battery 52, a voltage-measuring circuit 70 for obtaining the voltage of the cell 61, and a temperature-measuring circuit 90 for measuring the temperature of the cell 61. The cell 61 is a lithium-ion unit battery constituted by six cells of two-parallel three-series (1.8 Ah/cell).

The CPU 62 set in the intelligent battery 52 A/D (Analog-to-Digital)-converts an analog signal which is a measurement result input from the current-measuring circuit 63 or voltage-measuring circuit 70 inside and holds the information about a battery such as the capacity of the battery. The held information about a battery is transmitted to the embedded controller 41 of the system by the protocol of an SBS through the communication line 74 serving as a communication path.

In the case of the current-measuring circuit 63, a potential difference of voltage I'RS is generated at the both ends of a resistance (RS) 64 by a current I supplied from the cell 61. The voltage is differentially amplified by an operational amplifier (AMP1) 65. Moreover, a current I1 proportional to an output voltage of the operational amplifier (AMP1) 65 is supplied to a resistance (R1) 67 by an operational amplifier (AMP2) 66 and a transistor 68. Finally, the value of the current I of the intelligent battery 52 can be converted into a voltage VI1 "R2 generated in a resistance (R2) 69. The voltage (11 "R2) is output to the A/D #2 port of the CPU 62 and A/D-converted by the CPU 62.

Moreover, the voltage-measuring circuit 70 measures the voltage of the intelligent battery 52. Specifically, the voltage of the cell 61 of the intelligent battery 52 is differentially amplified and converted by an operational amplifier (AMP3) 71 and temporarily lowered to a low voltage and then, supplied to the A/D #1 port of the CPU 62 and A/D-converted by the CPU 62.

As shown in FIG. 2, in the temperature-measuring circuit 90, a thermistor (thermal sensor) 91 whose voltage is divided by a register is set nearby the cell 61 and a voltage generated by the thermistor 91 is applied to the A/D #3 port of the CPU 62. Thus, a voltage supplied from the thermistor 91 is read by the CPU 62 and A/D-converted by the CPU 62, and a temperature is measured. Thereby, the intelligent battery 52 can hold the temperature information in the battery.

Thus, in the case of the CPU 62, charge and discharge currents measured by the current-measuring circuit 63, a battery voltage measured by the voltage-measuring circuit 70, and temperature information obtained from the temperature-measuring circuit 90 are read and the capacity of the intelligent battery 52 (cell 61) or the like is controlled. Moreover, the CPU 62 transmits the data about a battery to the embedded controller 41 through the communication line 74 by using its communication function. The embedded controller 41 executes the control of stopping the power supply from the AC adapter 51 by the AC-adapter-power stop circuit 80 in accordance with a held battery state.

In this case, a battery capacity can be controlled by performing current accumulation (AH) or power accumulation (WH). When controlling the battery capacity in accordance with the AH unit, it is basically possible to Control the capacity of a battery only by a current value measured by the current-measuring circuit 63. However, when controlling the battery capacity in accordance with the WH unit, a battery capacity is controlled by using not only a current value measured by the current-measuring circuit 63 but also a battery voltage measured by the voltage-measuring circuit 70. A discharge current and a charge current supplied from the intelligent battery 52 (cell 61) are used as current values measured by the current-measuring circuit 63.

The structure in FIG. 2 is constituted so that a battery capacity or the like is checked by the CPU 62 of the intelligent battery 52 in a battery pack. However, it is also possible to use a dumb battery not including the CPU 62 instead of the intelligent battery 52. In this case, it is allowed to constitute a structure in which a current-measuring circuit for measuring charge and discharge currents of the dumb battery and a voltage-measuring circuit for measuring the voltage of the dumb battery are set in the system of the body (inside of the system) so as to check dumb-battery states including a battery capacity by the embedded controller 41.

Then, the AC-adapter-power stop circuit 80 is described below.

The AC-adapter-power stop circuit 80 has a function for stopping the power supplied from the AC adapter 51. The computer system 10 serving as a body system is constituted so that power can be supplied to the body circuit side from either of the AC adapter 51 and the intelligent battery 52 serving as a secondary battery having a higher voltage. When the AC adapter 52 is connected, the voltage of the AC adapter 51 is usually higher than that of the intelligent battery 52. Therefore, power is supplied to the body circuit from the AC adapter 51 via the first diode 77.

In this case, when a memory effect occurs in the intelligent battery 52 serving as a secondary battery, the power supply from the connected AC adapter 51 is stopped by the AC-adapter-power stop circuit 80 to realize complete discharge by the intelligent battery 52. That is, when executing the complete discharge of the intelligent battery 52 serving as a secondary battery, a high signal is supplied from the embedded controller 41 to the AC-adapter-power stop circuit 80. The first transistor (TR1) 82 of the AC-adapter-power stop circuit 80 is turned on by receiving the high signal. Because the first transistor 82 is turned on, the second transistor (TR2) 83 is turned off and an FET (FET1) 81 is turned off. Thereby, supply from the AC adapter 51 is stopped, power supply to the first diode 77 is stopped, and power can be supplied to the body circuit from the intelligent battery 52 via the second diode 78.

Then, troubleshooting of the battery of this embodiment is described below. In this case, troubleshooting of a battery is executed by displaying an error by an LCD 18 of the system body when the capacity of the battery is smaller than an estimated minimum capacity due to a trouble relating to the cell 61 of the intelligent battery 52.

FIG. 3 is an illustration showing an estimated minimum capacity of a battery used for this embodiment. The estimated minimum capacity shown in FIG. 3 is an estimated minimum capacity when assuming a condition of use of a notebook PC in applying the largest load to the battery. For example, in the case of the notebook PC, because use of the battery to which the above largest load or more is applied cannot be assumed, a trouble of the cell 61 of the intelligent battery 52 is considered when a full charge capacity (FCC) at a certain number of cycles is smaller than an estimated minimum capacity. In FIG. 3, the abscissa denotes the cycle count about charge and discharge and the ordinate denotes the rate (%) of a full charge capacity to a design capacity (DC). In the case of counting of the number of cycles (cycle count), only charged value is accumulated and when the charged value reaches 100%, this is regarded as 1 count and the cycle count is increased by 1.

In the case of this embodiment, a table or formula for estimated minimum capacity values is held in the intelligent battery 52 correspondingly to the estimated minimum capacity value shown in FIG. 3 and the values are compared with a full charge capacity. The estimated minimum capacity value or the information for the formula is stored in the CPU 62 when it has a built-in memory such as a one-chip microcomputer but stored in a memory outside of the CPU 62 when it has the memory outside of it. Troubleshooting states can be checked by the system by performing the troubleshooting in the battery and communicating the troubleshooting result to the embedded controller 41 at the system in accordance with the SBS protocol.

Moreover, it is possible to form a configuration so as to provide a table or formula corresponding to the estimated minimum capacity shown in FIG. 3 for the system and check battery states at the system. The configuration of holding the table or formula in the intelligent battery 52 describes above is superior in the fact that it is unnecessary to identify the type or maker of a battery at the system.

FIGS. 4(*a*) and 4(*b*) are illustrations showing assumed patterns to be used which most deteriorate a battery. The estimated minimum capacity shown in FIG. 3 is decided in accordance with the assumed patterns to be used shown in FIGS. 4(*a*) and 4(*b*). FIG. 4(*a*) shows the battery capacity to time in a day, in which the ordinate denotes battery capacity (%) and the abscissa denotes time in a day. FIG. 4(*b*) shows a temperature profile to time in a day, in which the ordinate denotes temperature (° C.) and the abscissa denotes time in a day.

The assumed patterns to be used shown in FIGS. 4(*a*) and 4(*b*) execute reproduction of a DVD for 10 hr in a day in a notebook PC. In 10 hr, a program is executed for approx. 1.7 hr (101 min) by the battery (intelligent battery 52) and for 8.3 hr by the AC adapter 51. Moreover, it is assumed that the power consumption of the system body is 20 W during DVD reproduction and the DVD is reproduced for 1.7 hr by the battery (intelligent battery 52) and then for 8.3 hr by connecting the AC adapter 51.

As shown in FIG. 4(*a*), the capacity of the intelligent battery 52 is decreased from 100% to 15% due to the discharge for 101 min through the battery operation. Then, by connecting the AC adapter 51 and performing charge for 187 min at 1 A, the capacity reaches 100% because the DVD is currently reproduced in the system body. As shown in FIG. 4(*b*), the temperature when executing the above operation temporarily rises from 37° C. up to 47° C. The estimated minimum capacity shown in FIG. 3 is decided in accordance with the capacity change data and temperature rise data of the intelligent battery 52 when performing the above operation.

In the case of an actual operating model by a normal user, it is assumed that the consumption of approx. 10 W is executed for 10 hr, and a program is executed for approx. 3.3 hr by the intelligent battery 52 and for 6.7 hr by the AC adapter 51. In this case, a change of capacities is from about 100% to 75% and it is expected that the temperature rises from 13° C. up to approx. 33° C.

FIGS. 5(*a*) and 5(*b*) are illustrations showing troubleshooting of a battery, in which FIG. 5(*a*) is a flowchart showing the flow of the troubleshooting and FIG. 5(*b*) is an illustration for assisting the description of FIG. 5(*a*). First, in the case of the troubleshooting of a battery in this embodiment, the full charge capacity of a battery is obtained by the CPU 62 of the intelligent battery 52 (step 101). How to obtain the full charge capacity will be described later.

Then, the CPU 62 determines whether the obtained full charge capacity is larger than the estimated minimum capacity shown in FIG. 3 (step 102). When the full charge capacity is not larger than the estimated minimum capacity, the information for "Battery Health" showing how the battery is healthy is displayed in "red", a message showing a message. "Replace the battery." is displayed (step 103), and the processing is completed. The message is executed by the LCD 18 serving as display means of the system as described later. FIG. 5(*b*) shows a curve equivalent to the estimated minimum capacity shown in FIG. 3 and it is determined in step 102 whether the curve is upper or lower than the curve showing the estimated minimum capacity. The indication "red" in step 103 corresponds to the case in which the curve is lower than the former curve is lower than the curve showing the estimated minimum capacity.

In step 102, when the full charge capacity is larger than the estimated minimum capacity shown in FIG. 3, it is determined whether the full charge capacity is larger than 50% of the design capacity (DC) (step 104). When the former capacity is not larger than 50% of the latter capacity, the color of the information for "Battery Health" is changed to "yellow", a message "Replace the battery." is displayed (step 105), and the processing is completed. It is determined in step 104 whether the full charge battery is larger or lower than the capacity 50% shown in FIG. 5(*b*) and the indication in "yellow" corresponds to the case in which the full charge capacity is upper than the curve of the estimated minimum capacity shown in FIG. 5(*b*) and lower than the line of the capacity 50%.

When it is determined in step 104 that the full charge capacity is larger than 50% of the design capacity (DC), the color of the information "Battery Health" is changed to "green", the message "The battery is normal." is displayed (step 106), and the processing is completed. The message corresponds to the case in which the full charge capacity is upper than the curve of the estimated minimum capacity shown in FIG. 5(*b*) and upper than the line of the capacity 50%.

FIG. 6 is an illustration showing an example of displaying battery diagnosis. This example is displayed on the LCD 18 by a utility program executed by the CPU 11 of the system. In this case, a health condition of a battery is displayed intuitively for a user by a color indication 201 and a message for prompting a user to a necessary operation is displayed by a message indication 202. In the case of the example shown in FIG. 6, a "Red" indication showing that a battery trouble is determined is displayed by a color indication 201 and a message "The Battery needs to be replaced." is displayed. When the full charge capacity of a battery is smaller than a certain specified value (e.g. 50% of DC) though the battery is normal, a message showing that the battery must be replaced soon is displayed with a "yellow" indication. Moreover, when a battery is normal and the full charge capacity of the battery is large enough, a message showing that it is unnecessary to replace the battery is displayed with a "green" indication.

Moreover, in the case of the example shown in FIG. 6, specific values are displayed as a full charge capacity, a design capacity, and the cycle count. Moreover, in the case of this embodiment, a predetermined date indication 203 is displayed. In the case of the date indication 203 shown in FIG. 6, the date "First Used Date" on which a user first used the intelligent battery 52 and the latest date "Last Refresh Operation" on which refresh was first executed. The intelligent battery 52 stores the date on which a user first used the intelligent battery 52 and the system (embedded controller 41) can read the date according to necessity. The read date is displayed as the date indication 203 shown in FIG. 6 and moreover, it is possible to use the read date to detect whether a battery is kept in the guarantee period by the system and communicate the information to a user. Moreover, it is possible to form a configuration so as to store the date information in a predetermined memory of the system. In this case, it is preferable that date information is stored together with battery identification information.

FIG. 7 is an illustration showing another indication example of battery diagnosis. In the case of the example shown in FIG. 7, necessary data content is displayed for each item. In this case, the value of a full charge capacity is displayed by red characters for an abnormal state (error, trouble, or failure) of the cell 61, by green characters when the cell 61 is normal, and by yellow characters when the cell 61 must be replace soon. By displaying the value by various colors, it is possible to make a user intuitively recognize a state of a battery.

Then, how to obtain a full charge capacity is described below. A full charge capacity showing the "current total capacity of a battery" is a value different from a design capacity showing the "total capacity of a batter in the initial state". Therefore, it is necessary to regularly perform update (leaning). In general, a full charge capacity is updated when a battery is completely discharged until the capacity of the battery becomes up to approx. 0% (e.g. 3%). This embodiment is constituted so that a full charge capacity can be automatically corrected even if a battery is not completely discharged. That is, this embodiment has an automatic update function for a full charge capacity by adding the processing for cycle deterioration and the processing for storage deterioration in addition to capacity leaning due to complete discharge.

In this case, the processing for cycle deterioration is first described.

FIG. 8 is a flowchart showing the processing for correcting cycle deterioration. In the case of the CPU 62 of the intelligent battery 52, the charged value stored in the intelligent battery 52 is first initialized and the cycle counter for the charged value is initialized (step 111). Thereafter, it is determined whether charge is performed (step 112). When charge is not performed, charge is waited. When charge is performed, a charged value is accumulated (step 113).

Then, it is determined whether the total accumulated charged value reaches a full charge capacity (whether the total charged value is equal to or more than FCC) (step 114). When the accumulated charged value does not reach the full charge capacity, step 112 is restarted. When the accumulated charged value reaches the full charge capacity (100% charged value), the cycle count is increased by 1 (step 115) and the expression "full charge capacity-design capacity×0.5/500" is introduced as a new full charge capacity (step 116) and step 111 is restarted.

The expression in step 116 represent that capacity deterioration of approx. 50% in terms of a battery capacity occurs when charge and discharge are repeated 500 times under predetermined temperature environments (e.g. 25° C. environment and 45° C. environment).

For the above mentioned, it is clarified in accordance with the measurement by the present inventor et al. that capacity deterioration increases almost proportionally to the cycle count but hardly depends on environmental temperature. From the result, it is found that a capacity to be deteriorated every cycle is based on the following expression.

Deterioration capacity=Design Capacity×0.5/500 [mAh or mWh]

Thus, in the case of the processing for correcting cycle deterioration in this embodiment, the cycle count is performed by accumulating only a charged value, regarding 100% charged value as 1 count, increasing the cycle count by 1, and subtracting the deterioration capacity obtained from the above expression from a full charge capacity.

Then, the processing for storage deterioration is described below.

FIG. 9 is an illustration showing storage deterioration characteristics of a lithium-ion battery. In this case, the abscissa denotes a storage time (month) and the ordinate denotes deterioration degree (%). In this case, six types of data values from 0 to 100% are shown every 20% as capacities. As shown in FIG. 9, it is understood that storage deterioration degrees of batteries depend on remaining capacities of the batteries. Actually, the storage-deterioration-characteristic diagram shown in FIG. 9 is prepared for each environmental temperature. As understood from FIG. 9, it is possible to almost fix the deterioration value for each unit time when a temperature and a remaining capacity are decided.

FIG. 10 is a flowchart showing the processing for correcting storage deterioration. In the CPU 62 of the intelligent battery 52, a storage-deterioration counter is first initialized (step 121). Then, it is determined whether one hour passes as unit time (step 122). Then, a battery capacity is obtained in accordance with charge and discharge currents from the current-measuring circuit 63 and an output voltage from the voltage-measuring circuit 70 (step 123) and a battery temperature is obtained from the temperature-measuring circuit 90 (step 124). By using the obtained battery capacity and battery temperature, a storage-deterioration value is obtained from the storage-deterioration table in FIG. 9 showing storage deterioration characteristics by numerical values (step 125).

When the storage deterioration value is obtained, the CPU 62 updates the storage-deterioration counter (step 126). Thereafter, it is determined whether the cycle count is increased (step 127). When the cycle count is not increased, step 122 is restarted. When the cycle count is increased, the processing is completed by using a value obtained by subtracting a storage deterioration value from the current full charge capacity as a new full charge capacity (step 128) and step 121 is restarted. That is, the storage deterioration value is accumulated and then subtracted when the cycle count increases by 1. Moreover, it is also possible to form a configuration so as to obtain a storage deterioration value in accordance with predetermined timing from a certain point of time instead of determining whether the cycle count is increased in step 127.

Then, the processing for updating a full charge capacity in accordance with capacity learning based on complete discharge is described below.

FIG. 11 is an illustration showing a flowchart for updating a full charge capacity in accordance with capacity learning. First, it is determined whether 100% charge is performed (step 131). Waiting is performed when 100% charge is not performed but a discharged value is initialized when 100% charge is performed (step 132). Then, it is determined whether discharge is performed (step 133). When discharge is performed, step 135 is restarted. When discharge is not performed, it is determined whether charge is performed (step 134). When charge is performed, step 131 is restarted to determine whether 100% charge is performed. When charge is not performed, step 135 is restarted.

In step 135, a discharged value is accumulated and it is determined whether a capacity decreases to 0% in accordance with an accumulated discharged value. In the case of the above determination, it is not always determined whether the capacity completely decreases to 0% but by assuming approx. 0% (e.g. 3%), it is determined whether the state can be regarded as complete discharge in accordance with the action and effect of the value of approx. 0%. When a capacity is 0% in step 136, step 133 is restarted. When the capacity is 0%, the accumulated charged value calculated in step 135 is assumed as a full charge capacity (step 137) and step 131 is restarted.

Thus, this embodiment is constituted so as to apply the correction of cycle deterioration described by referring to FIG. 8 and the correction due to storage deterioration described by referring to FIGS. 9 and 10 to a full charge capacity in addition to the update due to execution of complete discharge described for FIG. 11 and update the full charge capacity whenever the cycle count increases. As a result, even if complete discharge is not executed, the intelligent battery 52 can always hold a high-accuracy full charge capacity value and it is possible to troubleshoot the intelligent battery 52 in accordance with the full charge capacity value.

As described above, according to this embodiment, it is possible to display an error when the capacity of a battery (intelligent battery 52) is smaller than an estimated minimum capacity due to a trouble of the cell 61 of the battery. That is, an estimated minimum capacity when assuming the operation of a battery bearing the maximum load is previously decided to display an error depending on whether the battery capacity is smaller than the estimated minimum capacity. According to this configuration, when a user feels that the operating time of a battery is shortened, it is possible to determine whether the battery has a trouble or the battery is kept in its guarantee period.

Moreover, when the error is displayed and the user communicates that the error is displayed to, for example, a help center, a new battery for replacement is sent to the user from the help center free of charge when the old battery is kept in its guarantee period. By providing a function for storing the date on which a battery is first used for the battery, it is possible to determine a trouble of the battery in or out of its guarantee period. Therefore, the help center can determine whether to replace the battery having the trouble with a new one free of charge in accordance with correct determination on the contract.

As described above, the present invention makes it possible to accurately determine whether a battery has a trouble by an unit provided with a battery for supplying power to the body while repeating charge and discharge.

We claim as our invention:

1. A method comprising:
    obtaining a full charge capacity (FCC) value of a rechargeable battery;
    determining whether or not said FCC value is greater than an estimated minimum capacity value;
    in a determination that said FCC value is not greater than said estimated minimum capacity value, displaying a first message to indicate a first health condition of said rechargeable battery;
    in a determination that said FCC value is greater than said estimated minimum capacity value, determining whether or not said FCC value is greater than an acceptable battery health value;
    in a determination that said FCC value is not greater than said acceptable battery health value, displaying a second message to indicate a second health condition of said rechargeable battery; and
    in a determination that said FCC value is greater than said acceptable battery health value, displaying a third message to indicate a third health condition of said rechargeable battery; wherein the estimated minimum capacity of the battery is a changing estimate that is based on a historical performance of the battery.

2. The method of claim 1, wherein said estimated minimum capacity value decreases as the number of recharging cycles of said rechargeable battery increases.

3. The method of claim 1, wherein said acceptable battery health value equals to half of a design capacity value of said rechargeable battery.

4. The method of claim 1, wherein said method further includes adjusting said FCC value for cycle deterioration via decreasing said FCC value by 0.5/500×a design capacity value of said rechargeable battery.

5. The method of claim 1, wherein said method further includes adjusting said FCC value for storage deterioration via decreasing said FCC value by a storage deterioration value.

6. The method of claim 1, wherein said first message includes a message for prompting a user to replace said rechargeable battery.

7. The method of claim 6, wherein said first message is displayed in a red color.

8. The method of claim 1, wherein said second message includes a message for prompting a user to replace said rechargeable battery.

9. The method of claim 8, wherein said second message is displayed in a yellow color.

10. The method of claim 1, wherein said third message includes a message indicating said rechargeable battery is in good condition.

11. The method of claim 10, wherein said third message is displayed in a green color.

12. A computer readable medium having a computer program product for diagnosis health condition of a rechargeable battery, said computer readable medium comprising:
    computer program code for obtaining a full charge capacity (FCC) value of a rechargeable battery;
    computer program code for determining whether or not said FCC value is greater than an estimated minimum capacity value;
    computer program code for, in a determination that said FCC value is not greater than said estimated minimum capacity value, displaying a first message to indicate a first health condition of said rechargeable battery;
    computer program code for, in a determination that said FCC value is greater than said estimated minimum capacity value, determining whether or not said FCC value is greater than an acceptable battery health value;

computer program code for, in a determination that said FCC value is not greater than said acceptable battery health value, displaying a second message to indicate a second health condition of said rechargeable battery; and computer program code for, in a determination that said FCC value is greater than said acceptable battery health value, displaying a third message to indicate a third health condition of said rechargeable battery; wherein the estimated minimum capacity of the battery is a changing estimate that is based on a historical performance of the battery.

13. The computer readable medium of claim 12, wherein said estimated minimum capacity value decreases as the number of recharging cycles of said rechargeable battery increases.

14. The computer readable medium of claim 12, wherein said acceptable battery health value equals to half of a design capacity value of said rechargeable battery.

15. The computer readable medium of claim 12, wherein said computer readable medium further includes adjusting said FCC value for cycle deterioration via decreasing said FCC value by 0.5/500×a design capacity value of said rechargeable battery.

16. The computer readable medium of claim 12, wherein said computer readable medium further includes adjusting said FCC value for storage deterioration via decreasing said FCC value by a storage deterioration value.

17. The computer readable medium of claim 12, wherein said first message includes a message for prompting a user to replace said rechargeable battery.

18. The computer readable medium of claim 17, wherein said first message is displayed in a red color.

19. The computer readable medium of claim 12, wherein said second message includes a message for prompting a user to replace said rechargeable battery.

20. The computer readable medium of claim 19, wherein said second message is displayed in a yellow color.

21. The computer readable medium of claim 12, wherein said third message includes a message indicating said rechargeable battery is in good condition.

22. The computer readable medium of claim 21, wherein said third message is displayed in a green color.

23. An apparatus comprising:

a processor for obtaining a full charge capacity (FCC) value of a rechargeable battery;

an embedded controller for determining whether or not said FCC value is greater than an estimated minimum capacity value; and a display for displaying a first message to indicate a first health condition of said rechargeable battery if said FCC value is not greater than said estimated minimum capacity value;

displaying a second message to indicate a second health condition of said rechargeable battery if said FCC value is greater than said estimated minimum capacity value but not greater than an acceptable battery health value; and displaying a third message to indicate a third health condition of said rechargeable battery if said FCC value is greater than said acceptable battery health value; wherein the estimated minimum capacity of the battery is a changing estimate that is based on a historical performance of the battery.

24. The apparatus of claim 23, wherein said estimated minimum capacity value decreases as the number of recharging cycles of said rechargeable battery increases.

25. The apparatus of claim 23, wherein said acceptable battery health value equals to half of a design capacity value of said rechargeable battery.

26. The apparatus of claim 23, wherein said apparatus further includes adjusting said FCC value for cycle deterioration via decreasing said FCC value by 0.5/500×a design capacity value of said rechargeable battery.

27. The apparatus of claim 23, wherein said apparatus further includes adjusting said FCC value for storage deterioration via decreasing said FCC value by a storage deterioration value.

28. The apparatus of claim 23, wherein said first message includes a message for prompting a user to replace said rechargeable battery.

29. The apparatus of claim 28, wherein said first message is displayed in a red color.

30. The apparatus of claim 23, wherein said second message includes a message for prompting a user to replace said rechargeable battery.

31. The apparatus of claim 30, wherein said second message is displayed in a yellow color.

32. The apparatus of claim 23, wherein said third message includes a message indicating said rechargeable battery is in good condition.

33. The apparatus of claim 32, wherein said third message is displayed in a green color.

* * * * *

UNITED STATES PATENT AND TRADEMARK OFFICE
CERTIFICATE OF CORRECTION

PATENT NO. : 7,663,374 B2
APPLICATION NO. : 10/247600
DATED : February 16, 2010
INVENTOR(S) : Odaohhara et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1434 days.

Signed and Sealed this

Thirtieth Day of November, 2010

David J. Kappos
*Director of the United States Patent and Trademark Office*